United States Patent
Herrault et al.

(10) Patent No.: US 9,508,652 B1
(45) Date of Patent: Nov. 29, 2016

(54) DIRECT IC-TO-PACKAGE WAFER LEVEL PACKAGING WITH INTEGRATED THERMAL HEAT SPREADERS

(71) Applicant: HRL Laboratories, LLC, Malibu, CA (US)

(72) Inventors: Florian G. Herrault, Agoura Hills, CA (US); Melanie S. Yajima, Los Angeles, CA (US); Alexandros Margomenos, San Jose, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/950,667

(22) Filed: Nov. 24, 2015

(51) Int. Cl.
- H01L 23/34 (2006.01)
- H01L 23/538 (2006.01)
- H01L 21/78 (2006.01)
- H01L 23/367 (2006.01)
- H01L 23/00 (2006.01)
- H01L 23/40 (2006.01)

(52) U.S. Cl.
CPC .......... *H01L 23/5389* (2013.01); *H01L 21/78* (2013.01); *H01L 23/367* (2013.01); *H01L 23/40* (2013.01); *H01L 24/11* (2013.01); *H01L 24/16* (2013.01); *H01L 2223/6644* (2013.01); *H01L 2924/15* (2013.01)

(58) Field of Classification Search
None
See application file for complete search history.

(56) References Cited

U.S. PATENT DOCUMENTS

| | | | |
|---|---|---|---|
| 3,681,513 A | 8/1972 | Hargis | |
| 5,073,521 A | 12/1991 | Braden | |
| 5,198,385 A | 3/1993 | Devitt et al. | |
| 5,276,455 A | 1/1994 | Fitzsimmons et al. | |
| 5,371,404 A | 12/1994 | Juskey et al. | |
| 6,018,459 A | 1/2000 | Carlson et al. | |
| 6,028,367 A | 2/2000 | Yu | |
| 6,249,439 B1 | 6/2001 | DeMoore et al. | |
| 6,900,765 B2 | 5/2005 | Navarro et al. | |
| 6,989,592 B2 | 1/2006 | Chang et al. | |
| 7,015,060 B1 * | 3/2006 | Kubena | G01C 19/5719 435/51 |
| 7,067,397 B1 | 6/2006 | Chang-Chien et al. | |
| 7,271,479 B2 | 9/2007 | Zhao et al. | |
| 7,292,381 B1 | 11/2007 | Patterson et al. | |
| 7,364,063 B2 | 4/2008 | Schaenzer et al. | |
| 7,683,469 B2 | 3/2010 | Oh et al. | |
| 7,733,265 B2 | 6/2010 | Margomenos et al. | |
| 7,777,315 B2 | 8/2010 | Noquil | |
| 7,808,013 B2 | 10/2010 | Mendendorp et al. | |

(Continued)

OTHER PUBLICATIONS

U.S. Appl. No. 14/286,923, filed May 23, 2014, Margomenos et al.

(Continued)

*Primary Examiner* — Fei Fei Yeung Lopez
(74) *Attorney, Agent, or Firm* — Ladas & Parry

(57) ABSTRACT

A method for wafer level packaging includes forming one or more die, forming a plated metal ring (PMR) on each die, forming a cover wafer (CW), the CW having one or more plated seal rings, forming a body wafer (BW), the BW having cavities and a metal layer on a first side of the BW, aligning a respective die to the CW so that a PMR on the respective die is aligned to a respective plated seal ring (PSR) on the CW, bonding the PMR on the respective die to the respective PSR, aligning the BW to the CW so that a respective cavity of the BW surrounds each respective die bonded to the CW and so that the metal layer on the BW is aligned with at least one PSR on the CW, and bonding the metal layer on the first side of the BW to the PSR on the CW. Each PMR has a first height and each PSR has a second height.

20 Claims, 13 Drawing Sheets

(56) References Cited

U.S. PATENT DOCUMENTS

| | | | |
|---|---|---|---|
| 8,093,690 | B2 | 1/2012 | Ko et al. |
| 8,334,592 | B2 | 12/2012 | Bhagwagar et al. |
| 8,375,576 | B2 | 2/2013 | Kwon |
| 8,617,927 | B1 | 12/2013 | Margomenos et al. |
| 8,644,020 | B2 | 2/2014 | Lau et al. |
| 9,059,140 | B1 | 6/2015 | Margomenos et al. |
| 9,214,404 | B1 | 12/2015 | Margomenos et al. |
| 2003/0006499 | A1 | 1/2003 | Choi |
| 2005/0077596 | A1 | 4/2005 | Bauer et al. |
| 2005/0155752 | A1 | 7/2005 | Larson et al. |
| 2006/0027635 | A1 | 2/2006 | Schaenzer et al. |
| 2006/0091509 | A1 | 5/2006 | Zhao et al. |
| 2006/0157223 | A1 | 7/2006 | Gelorme et al. |
| 2006/0292747 | A1 | 12/2006 | Loh |
| 2007/0015666 | A1 | 1/2007 | Thieme et al. |
| 2007/0075420 | A1 | 4/2007 | Lu et al. |
| 2007/0247851 | A1 | 10/2007 | Villard |
| 2007/0290326 | A1 | 12/2007 | Yang et al. |
| 2008/0099770 | A1 | 5/2008 | Mendendorp |
| 2008/0128897 | A1 | 6/2008 | Chao |
| 2008/0179725 | A1 | 7/2008 | Chia et al. |
| 2008/0298021 | A1 | 12/2008 | Ali et al. |
| 2009/0108437 | A1 | 4/2009 | Raymond |
| 2009/0134421 | A1 | 5/2009 | Negley |
| 2009/0294941 | A1 | 12/2009 | Oh et al. |
| 2009/0309209 | A1 | 12/2009 | Chen |
| 2010/0140799 | A1 | 6/2010 | Do et al. |
| 2010/0283144 | A1 | 11/2010 | Liang |
| 2010/0327465 | A1 | 12/2010 | Shen et al. |
| 2012/0217627 | A1 | 8/2012 | Tseng et al. |
| 2014/0084445 | A1 | 3/2014 | Lin |
| 2015/0007965 | A1 | 1/2015 | Joshi |

OTHER PUBLICATIONS

U.S. Appl. No. 14/532,761, filed Nov. 4, 2014, Herrault et al.
U.S. Appl. No. 14/703,545, filed May 4, 2015, Margomenos et al.
U.S. Appl. No. 14/720,619, filed May 22, 2015, Herrault et al.
Chen, K. C., et al., "Thermal Management and Novel Package Design of High Power Light Emitting Diodes," National Cheng Kung University, Taiwan, 2008 *Electronic Components and Technology Conference*, pp. 795-797, (May 2008).
Feeler, R., et al., "Next-Generation Microchannel Coolers," Northrop Grumman, *Proceedings of SPIE*, vol. 6876, pp. 687608-1-687608-8, (2008).
Herrault F. et al., "Silicon-Packaged GaN Power HEMTs with Integrated Heat Spreaders," Electronic Components and Technology Conference (ECTC), 2015 IEEE 65$^{th}$, Conference: (May 26 to May 29, 2015).
Margomenos A. et al., "Novel Packaging, Cooling and Interconnection Method for GaN High Performance Power Amplifiers and GaN Based RF Front-Ends," *Proceedings of the 7$^{th}$ European Microwave Integrated Circuits Conference*, pp. 615-618, (Oct. 29-30, 2012).
Margomenos, A. et al., "Wafer-Level Packaging Method Incorporating Embedded Thermal Management for GaN-Based RF Front-Ends," IEEE Intersociety Conference on Thermal and Thermomechanical Phenomena in Electronic Systems (ITHERM), May 27-30, 2014 in Orlando, Florida.
Margomenos, A. et al., "X-Band Highly Efficient GaN Power Amplifier Utilizing Built-In Electroformed Heat Sinks for Advanced Thermal Management," *IEEE International Microwave Symposium*, pp. 1-4, (Jun. 2-7, 2013).
P. Chang-Chien et al., "MMIC Packaging and Heterogeneous Integration Using Wafer-Scale Assembly," CS Mantech Conference, pp. 143-146, (May 14-17, 2007).
From U.S. Appl. No. 13/306,827 (Now U.S. Pat. No. 8,617,927), Restriction/Election mailed on Jan. 9, 2013.
From U.S. Appl. No. 13/306,827 (Now U.S. Pat. No. 8,617,927), Non-Final Rejection mailed on Mar. 7, 2013.
From U.S. Appl. No. 13/306,827 (Now U.S. Pat. No. 8,617,927), Notice of Allowance mailed on Aug. 15, 2013.
From U.S. Appl. No. 14/054,572 (Now U.S. Pat. No. 9,059,140), Restriction/Election mailed on Jul. 10, 2014.
From U.S. Appl. No. 14/054,572 (Now U.S. Pat. No. 9,059,140), Non-Final Rejection mailed on Sep. 19, 2014.
From U.S. Appl. No. 14/054,572 (Now U.S. Pat. No. 9,059,140), Notice of Allowance mailed on Feb. 12, 2015.
From U.S. Appl. No. 14/080,691 (Now U.S. Pat. No. 9,214,404), Restriction/Election mailed on Dec. 17, 2014.
From U.S. Appl. No. 14/080,691 (Now U.S. Pat. No. 9,214,404), Non-Final Rejection mailed on Apr. 16, 2015.
From U.S. Appl. No. 14/080,691 (Now U.S. Pat. No. 9,214,404), Notice of Allowance mailed on Aug. 12, 2015.
From U.S. Appl. No. 14/286,923, filed May 23, 2014; Unpublished, Non-Publication Requested), Application and Office Actions.
From U.S. Appl. No. 14/532,761 (Unpublished, Non-Publication Requested), Non-Final Rejection mailed on Oct. 6, 2015.
From U.S. Appl. No. 14/703,545 (Unpublished, Non-Publication Requested), Non-Final Rejection mailed on Dec. 15, 2015.
From U.S. Appl. No. 14/720,619 (Unpublished, Non-Publication Requested), Restriction/Election mailed on Sep. 28, 2015.

\* cited by examiner

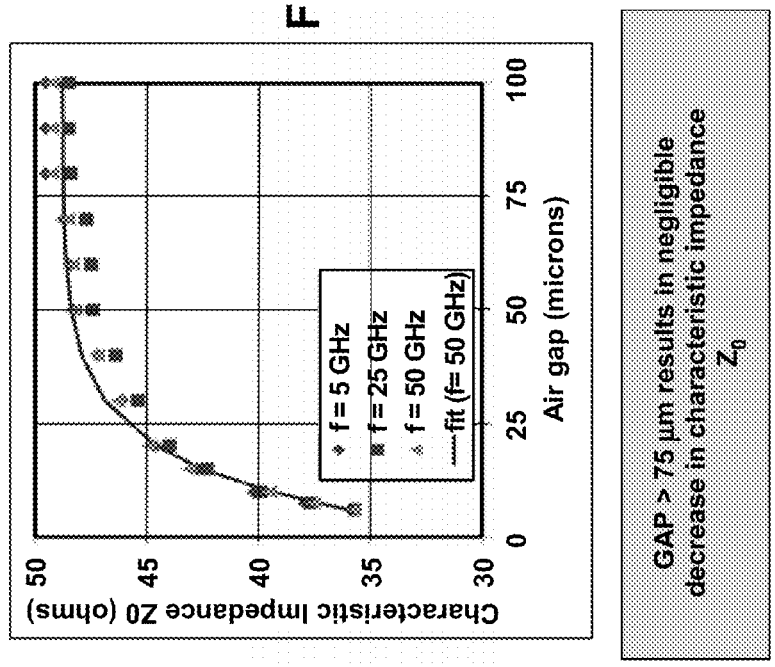
FIG. 3C
GAP > 75 μm results in negligible decrease in characteristic impedance $Z_0$
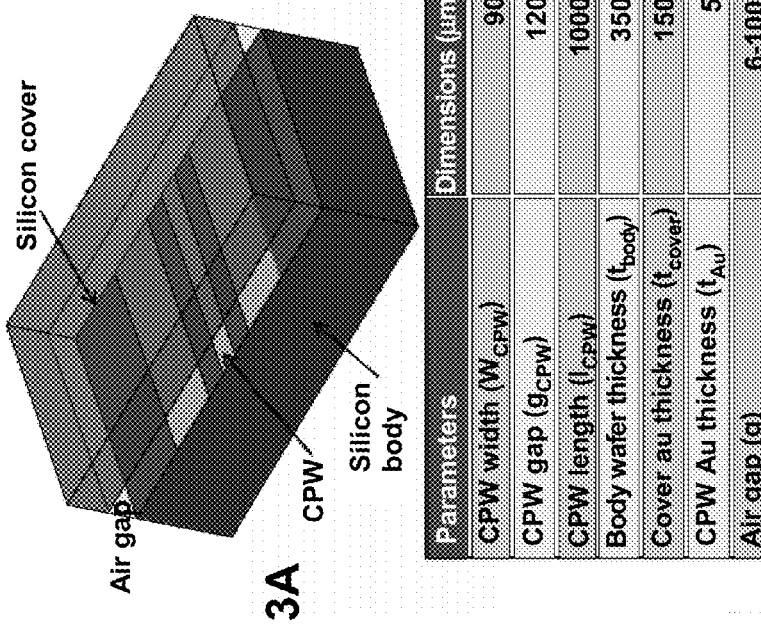
FIG. 3A
| Parameters | Dimensions (μm) |
|---|---|
| CPW width ($W_{CPW}$) | 90 |
| CPW gap ($g_{CPW}$) | 120 |
| CPW length ($l_{CPW}$) | 1000 |
| Body wafer thickness ($t_{body}$) | 350 |
| Cover au thickness ($t_{cover}$) | 150 |
| CPW Au thickness ($t_{Au}$) | 5 |
| Air gap (g) | 6-100 |
FIG. 3B

DIRECT IC-TO-PACKAGE WAFER LEVEL PACKAGING WITH INTEGRATED THERMAL HEAT SPREADERS

CROSS REFERENCE TO RELATED APPLICATIONS

This application relates to U.S. Pat. No. 8,617,927, issued Dec. 31, 2013, which is incorporated herein by reference as though set forth in full.

STATEMENT REGARDING FEDERAL FUNDING

None

TECHNICAL FIELD

This disclosure relates to wafer-level packaging for integrated circuits and methods for making wafer-level packages for integrated circuits.

BACKGROUND

In the prior art, A Margomenos, et al describe in U.S. Pat. No. 8,617,927, issued Dec. 31, 2013, a surface mount package for GaN devices with embedded heat spreaders. A. Margomenos, et al also describe packaging, methods in "Novel Packaging, Cooling and Interconnection Method for GaN High Performance Power Amplifiers and GaN based RF Front-Ends" European Microwave Conference 2012, which is incorporated herein by reference. Further, A. Margomenos, et al describe thermal management for power amplifiers in "X-Band Highly Efficient GaN Power Amplifier Utilizing Built-In Electroformed Heat Sinks for Advanced Thermal Management", IEEE International Microwave Symposium 2013, which is incorporated herein by reference. The above A. Margomenos references present cooling packaging and interconnection methods for wide band gap devices. However, the interconnection methods rely on wire bonds or electroplated interconnects to connect the microelectronic chips to the packaging. These interconnection methods result in direct current (DC) and radio frequency (RF) losses, increased cost, and increased package volume over what is desirable. Additionally, the microelectronic chips, namely, GaN on SiC monolithic microwave integrated circuits (MMICs), require additional processing steps for packaging compatibility, such as processing steps for adding benzocyclobutene (BCB) layers. Such steps add high-frequency losses due to increased parasitic capacitances due to the dielectric constant of BCB. There is also increased cost due to an approximate 10% increase in processing time due to the added processing steps with BCB.

In addition, the heat spreader fabrication approach described by A. Margomenos, et al in "X-Band Highly Efficient GaN Power Amplifier Utilizing Built-In Electroformed Heat Sinks for Advanced Thermal Management", IEEE International Microwave Symposium 2013 relies on sidewall electroplating followed by polishing. This can result in voids inside the heat spreaders when fabricating very compact packages, especially when the lateral dimensions of the heat spreaders are incrementally larger than the lateral dimensions of the chips to be embedded.

U.S. Published Patent Application 2007/0290326, filed Oct. 15, 2006, which is incorporated herein by reference, describes multi-dimensional wafer-level integrated antenna sensor micro packaging, and U.S. Pat. No. 7,067,397, issued Apr. 13, 2010, which is incorporated herein by reference, describes a method of fabricating high yield wafer level packages integrating MMIC and MEMS components. MMIC packaging using wafer scale assembly is described in "MMIC Packaging and Heterogeneous Integration Using Wafer-Scale Assembly", Mantech conference, 2007, which is incorporated herein by reference. These references, while describing wafer level integration, do not address the integration of thermal heat spreaders.

U.S. Pat. No. 8,093,690, issued Jan. 10, 2012, which is incorporated herein by reference, is related to chip packaging with conductive interconnects and a shielding layer; however, this reference also does not address the integration of a heat spreader.

What is needed is a low-cost and manufacturable wafer-level packaging technology for low-loss and high-performance RF packages that combines advanced microelectronic chips, integrated thermal heat spreaders, hermetically-sealed cavities, and low-loss through-wafer interconnects. The embodiments of the present disclosure answer these and other needs.

SUMMARY

In a first embodiment disclosed herein, a method for wafer level packaging comprises forming one or more die, forming a plated metal ring on each die, forming a cover wafer, the cover wafer having one or more plated seal rings, forming a body wafer, the body wafer having cavities and a metal layer on a first side of the body wafer, aligning a respective die to the cover wafer so that a plated metal ring on the respective die is aligned to a respective plated seal ring on the cover wafer, bonding the plated metal ring on the respective die to the respective plated seal ring, aligning the body wafer to the cover wafer so that a respective cavity of the body wafer surrounds each respective die bonded to the cover wafer and so that the metal layer on the body wafer is aligned with at least one plated seal ring on the cover wafer, and bonding the metal layer on the first side of the body wafer to the plated seal ring on the cover wafer, wherein each plated metal ring has a first height and each plated seal ring has a second height.

In another embodiment disclosed herein, a wafer level package comprises one or more die, a plated metal ring on each die, a cover wafer, the cover wafer having one or more plated seal rings, wherein the plated metal ring on a respective die is bonded to a respective plated seal ring, and a body wafer, the body wafer having cavities and a metal layer on a first side of the body wafer, wherein the metal layer on the first side of the body wafer is bonded to the plated seal ring on the cover wafer, and wherein each respective cavity surrounds respective die, wherein each plated metal ring has a first height and each plated seal ring has a second height.

In yet another embodiment disclosed herein, a method for wafer level packaging comprises forming an integrated circuit wafer having a plurality of circuit regions, forming a plurality of plated metal rings, each plated metal ring surrounding a respective circuit regions, forming a cover wafer, the cover wafer having one or more plated seal rings and one or more cavities, forming a body wafer, the body wafer having cavities and a metal layer on a first side of the body wafer, aligning the integrated circuit wafer to the cover wafer so that a plated metal ring on each respective circuit region is aligned to a respective plated seal ring on the cover wafer, and so that each circuit region is aligned to a respective cavity in the cover wafer, bonding the plurality of plated metal rings to the respective aligned plated seal rings using thermocompression bonding, aligning the body wafer to the integrated circuit wafer so that each respective cavity of the body wafer is aligned with each respective circuit region, and bonding the body wafer to the integrated circuit wafer using thermocompression bonding, and electroforming a respective heat spreader in each cavity of the body wafer, wherein each plated metal ring has a first height and each plated seal ring has a second height.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 3A shows a model, FIG. 3B shows the parameters of the model, and FIG. 3C shows the results of a HFSS model in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a method to fabricate a wafer-level package for microelectronic circuits having integrated thermal heat spreaders, a hermetic cavity for one or more microelectronic chips, and through-wafer electrical DC and RF interconnects. Advanced 3-D interconnect topologies coupled with advanced integrated thermal management are enabled with the present disclosure. The present disclosure also provides for wafer-level modules that utilize technologies such as multi-chip stacking, interposers, and wafer-level packaging of integrated circuit (IC) wafers. In particular the present disclosure addresses challenges associated with packaging RF microelectronic chips inside a hermetically-sealed cavity with integrated thermal heat spreaders and direct through-wafer interconnects using silicon micromachining and electroplating technologies.

The present disclosure combines the bonding of known-good microelectronic chips, such as wide band gap semiconductors, such as GaN on SiC, onto a cover wafer with pre-fabricated interconnects to interconnects, a hermetically-sealed cavity for the chips, and integrated thermal heat spreaders in direct contact with the backside of the microelectronic chips for excellent thermal management.

In the prior art, as discussed above wafer-level packaging has used wire-bonding and electroplated interconnects to connect the chips to through-wafer interconnects, and the result is a higher interconnect loss of about 0.4 dB per interconnect at 20 GHz than the packaging of the present disclosure. In addition, the present disclosure describes a shorter and more cost-effective process compared to the approximately $1 per wire bond cost for the prior art. In the prior art, die packaging usually requires die encapsulation using, for example, epoxy or BCB, to protect the dice during the packaging process. The present disclosure avoids the disadvantages associated with die encapsulation, and only requires one additional electroplating step in a standard MMIC fabrication sequence.

Figure 1:
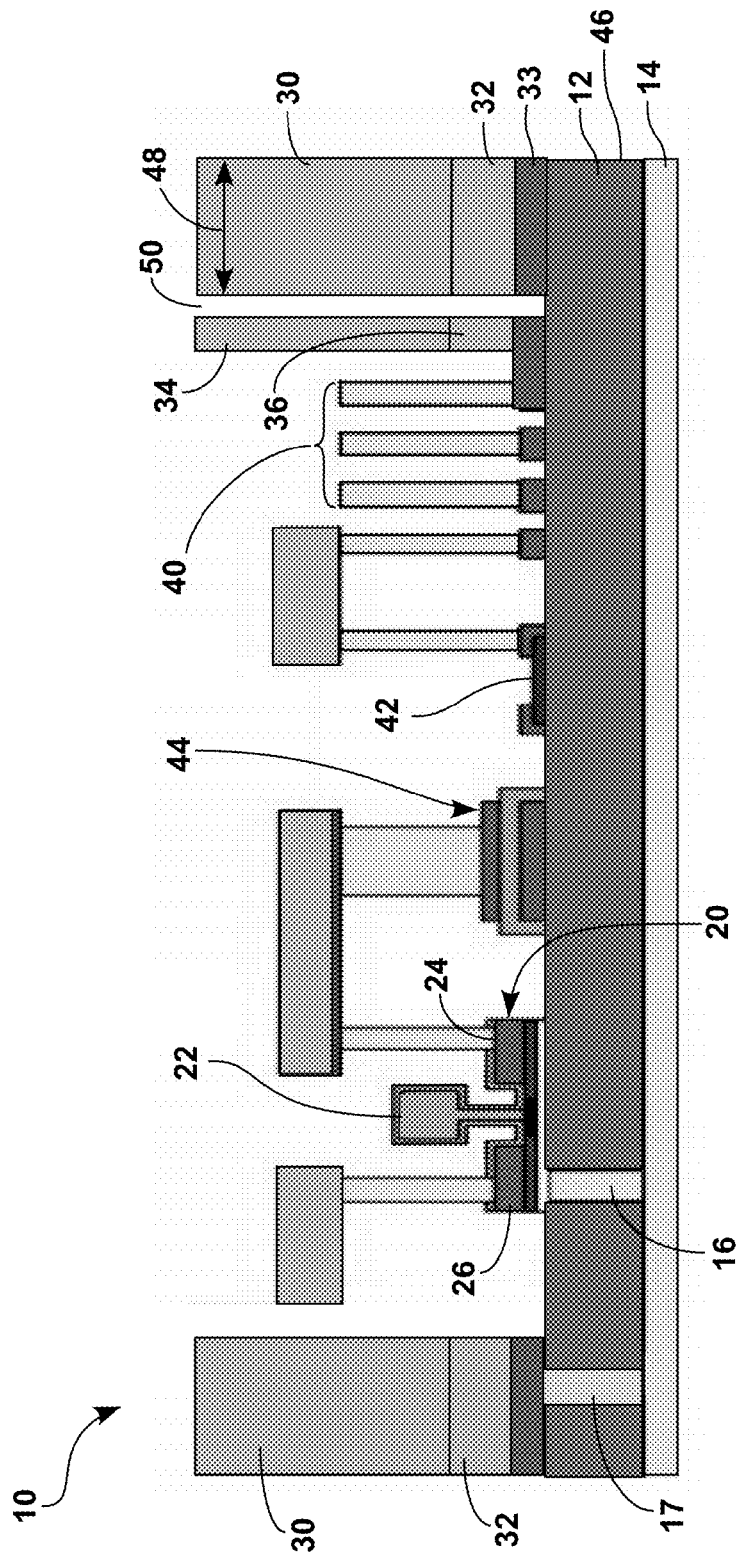
FIG. 1 is a schematic showing a die, which may be a MMIC, with a double-plated sealing ring and double-plated electrical bumps in accordance with the present disclosure.

In the present disclosure, known good dice 10 are first picked from a tested wafer, which may be any IC wafer such as GaN-on-SiC, GaAs, InP, CMOS or others known by experts in the field. FIG. 1, for example, shows a GaN on SiC die 10. The die 10 may be a MMIC and include one or more transistors 20 on the substrate 12. The transistor 20 shown in FIG. 1 is a HEMT 20 having a gate 22, a source 24, and a drain 26; however, the transistor 20 may be any other type of transistor including different types of field effect transistors and bipolar transistors. The transistor 20 may be connected for electrical grounding to backside metal 14 on the backside of the substrate 12, by a backside via 16 through the substrate 12. The backside metal 14 may be gold. The die 10 may also include one or more circuits on the substrate 12, such as inductor 40, resistor 42, and capacitor 44. For wafer-level packaging process compatibility, the die 10 has a double-plated metal ring 30, 32 on the edge of the die 10. Metal ring 30 is plated on top of metal ring 32. Each metal ring 30 and 32 may be gold (Au) and each metal ring may be 3 to 5 microns thick. Thus, the double-plated metal ring 30, 32 may have a total thickness in the range of 6 to 10 microns, which is high enough to protect air bridge interconnects on the die 10. A thin metal layer 33, which may be Au, may be deposited by sputtering on the substrate 12 to initiate the plating of metal ring 32.

The die 10 also has double-plated bumps 34, 36. Bump 34 is plated on top of bump 36. Each bump 34 and 36 may be gold (Au) and each bump may be 3 to 5 microns thick. Thus, the double-plated bump 34, 36 may have a total thickness in the range of 6 to 10 microns. The double-plated bumps 34, 36 are used for interconnect.

In the above, double plating is used instead of a single plating, because 5 micron thick plating is standard, and plating a single layer to be 10 microns thick stresses the plating art. However, a single layer metal ring may be used and satisfies the needs of the present disclosure if made a sufficient thickness.

It is important that the thickness of the double-plated metal ring 30, 32 and the thickness of the double-plated bumps 34, 36 be uniform or the same across the wafer so that thermocompression die-to-package bonding may be performed at a later stage of the die packaging process.

It is preferable that the double-plated metal ring 30, 32 be near a die edge 46, and in a preferred embodiment, the distance between the die edge 46 and the double-plated metal ring 30, 32 is less than or equal to 50 microns in order to maximize the extent of the cavity for circuitry within the double-plated metal ring 30, 32. The width 48 of the double-plated metal ring 30, 32 can range from 10 to 200 microns and may be typically 50 microns. The double-plated metal ring 30, 32 may be connected for electrical grounding to backside metal 14, on the backside of the substrate 12, by a backside via 17 through the substrate 12 in order to reduce or eliminate parasitic capacitive coupling, which otherwise may cause resonance at RF frequencies.

The double-plated metal ring 30, 32 has two major advantages. First, the double-plated metal ring 30, 32, as explained further below, enables sealing the die within a cavity for hermetically-sealed die packaging, which is desirable for high-reliability chip operation. Second the double-plated metal ring 30, 32 enables microfabrication of integrated thermal heat spreaders, which are critical for thermal management.

The double-plated bumps 34, 36 provide electrical interconnects. In addition, the double-plated bumps 34, 36 provide additional mechanical support and protection around the die. There is a lateral gap 50 between the double-plated metal ring 30, 32 and the double-plated bumps 34, 36. It is preferable that the lateral gap 50 be at least 100 microns to eliminate parasitic capacitive coupling.

Figure 2:
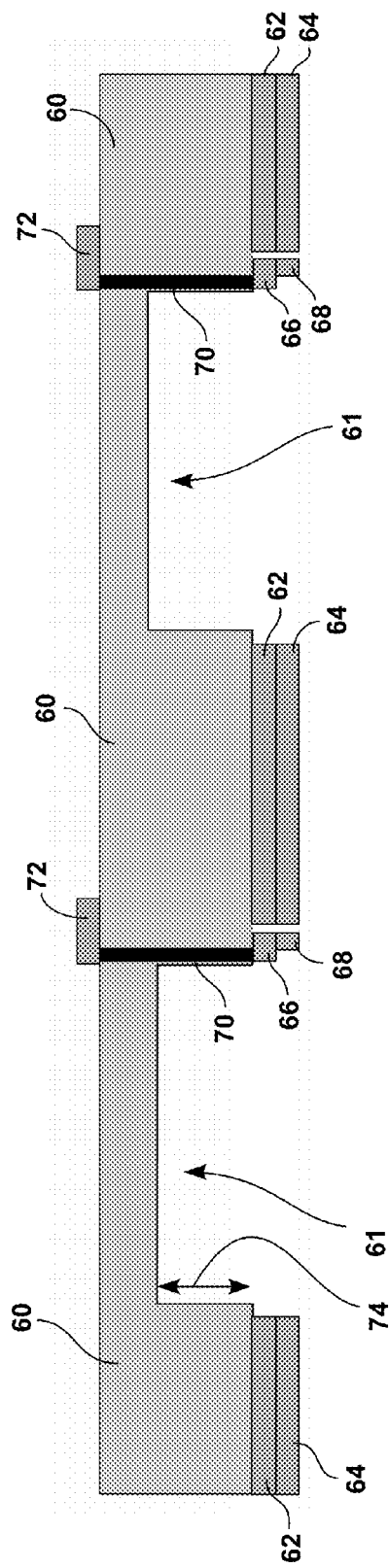
FIG. 2 shows a schematic showing a cross section of a cover wafer in accordance with the present disclosure.

FIG. 2 shows a cover wafer 60 in accordance with the present disclosure. The cover wafer 60 may be high-resistivity silicon, quartz, glass, silicon carbide or other materials. The cover wafer 60 contains one or more cavities 61. Through wafer electrical interconnects 70 may be included, and the interconnects 70 may be copper-filled. The through wafer via for the wafer electrical interconnects 70 is coated first with one or more diffusion barrier layers, which may be Ta, TaN, TiN or $SiO_2$ to prevent copper diffusion into the cover wafer 60. The through wafer electrical interconnects 70 may be connected to topside circuitry 72 for radio frequency (RF) and direct current (DC) interconnects. The topside circuitry may be any combination of active, such as transistors, and passive electronic components, such as resistors, capacitors or inductors, or may be only an interconnect for RF or DC inputs or outputs. On the cover wafer 60 are bottom side double-plated sealing rings 62, 64 and bottom side double-plated bumps 66, 68. The double-plated sealing rings 62, 64 and the double-plated bumps 66, 68 are critical, not only to package the IC die and enable interconnects and heat spreader integration, but also to mitigate effects of potential parasitic capacitive coupling from the cover wafer 60 to the IC die 10, therefore enabling high-performance operation. FIG. 2 shows a cross-sectional schematic of a cover wafer 60 with two cavities 61.

For high-frequency operation up to Q band, a high-resistivity silicon cover wafer 60 may be used and have a thickness of 150 microns or less. In order to minimize dielectric loading of the cover wafer 60 on the die 10, the cavities 61 preferably have a depth 74 on the order of 75 microns.

FIG. 3A shows a model and FIG. 3B shows the parameters of the model for deriving requirements on the cavity in the silicon cover wafer. FIG. 3C shows the results of a HFSS model where the characteristic impedance of a coplanar waveguide (CPW) transmission line was modeled as a function of the air gap between the surface of the CPW and a silicon wafer. Although this is a simplified model over an IC die, this is representative of the minimum air gap needed between the circuitry on the IC die 10 and the cover wafer 60 to maintain a 50 Ohm characteristic impedance. The results are plotted in FIG. 3C, and as indicated above, an air gap of 75 microns is required to avoid dielectric loading and parasitic capacitive coupling, which would otherwise reduce the impedance of the CPW transmission line.

Figure 4A:
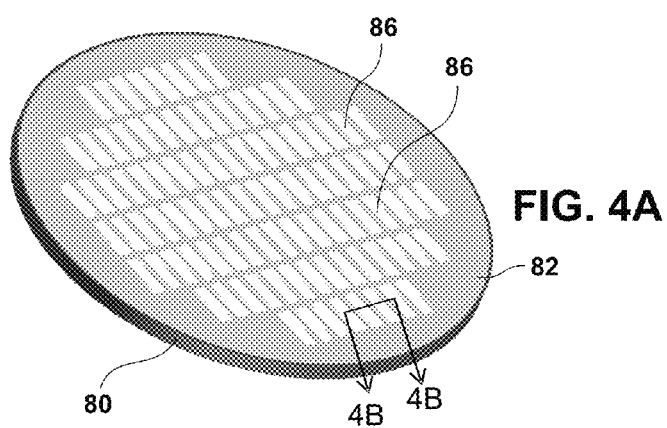
FIG. 4A shows a body wafer.
Figure 4B:
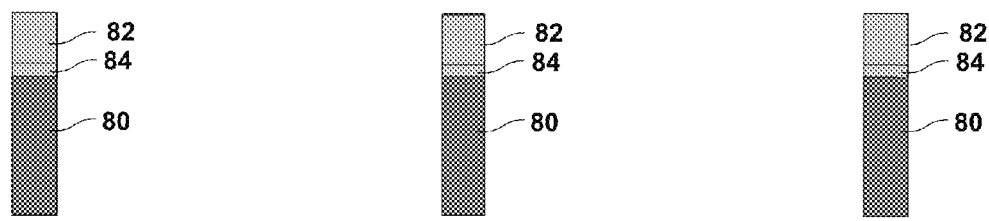
FIG. 4B shows a cross section of FIG. 4A in accordance with the present disclosure.

FIG. 4A shows a body wafer 80, and FIG. 4B shows a cross section of FIG. 4A in accordance with the present disclosure. The body wafer 80 may be high-resistivity silicon, quartz, glass, silicon carbide or other materials. Preferably, the body wafer 80 is made of the same material as the cover wafer 60, so that the coefficients of temperature are matched. The thickness of the body wafer 80 is dependent on the die 10 thickness, which for example may be 50 to 60 microns. For example, the substrate 12 may be 50 microns and the height of the double plated rings 30, 32 may be 10 microns for a total thickness of 60 microns. The body wafer 10 thickness needs to be at least of the same thickness as the die 10 thickness, as is evident in FIGS. 7B, 7C, and 7D, and preferably at least twice as thick as the die 10 thickness to provide thermal management. Initially, cavities 86 in the body wafer 10 may be etched using silicon deep reactive ion etching. The size of the cavities 86 is dependent on the dimension of the die 10, and should be larger than the die 10 by at least 5 microns on each edge of the cavity 86, and may be 200 microns or larger on each edge. After cavity 86 etching, the body wafer 80 is oxidized using thermal oxidation. The oxide may be $SiO_2$ and be approximately 0.5 micron thick, though it can range from 0.1 to 5 microns. Finally, a Ti layer 84 is evaporated on one side of the wafer and an Au layer 82 is evaporated on the Ti layer 84. The thicknesses of the evaporated layers may be on the order of 300 A and 10,000 A for the Ti layer 84 and for the Au 82 layer, respectively.

The cover wafer, the body wafer, and the die 10 all feature alignment marks to maintain alignment accuracy better than 5 microns for the die 10 to cover wafer 60 bonding and better than 10 microns for the cover wafer 60 to body wafer 80 bonding.

The next step consists of bonding the die 10 to the cover wafer 60 using gold-to-gold thermocompression bonding. Temperatures ranging from 200 C to 300 C, forces ranging from 2 to 10 Kg, and bonding times on the order of 5 minutes may be used to achieve good electrical and mechanical bonds. A high-accuracy die bonder SET FC300 can be utilized for this step, and it is preferable to perform this step under controlled (e.g., inert gas) atmosphere.

Figure 5:
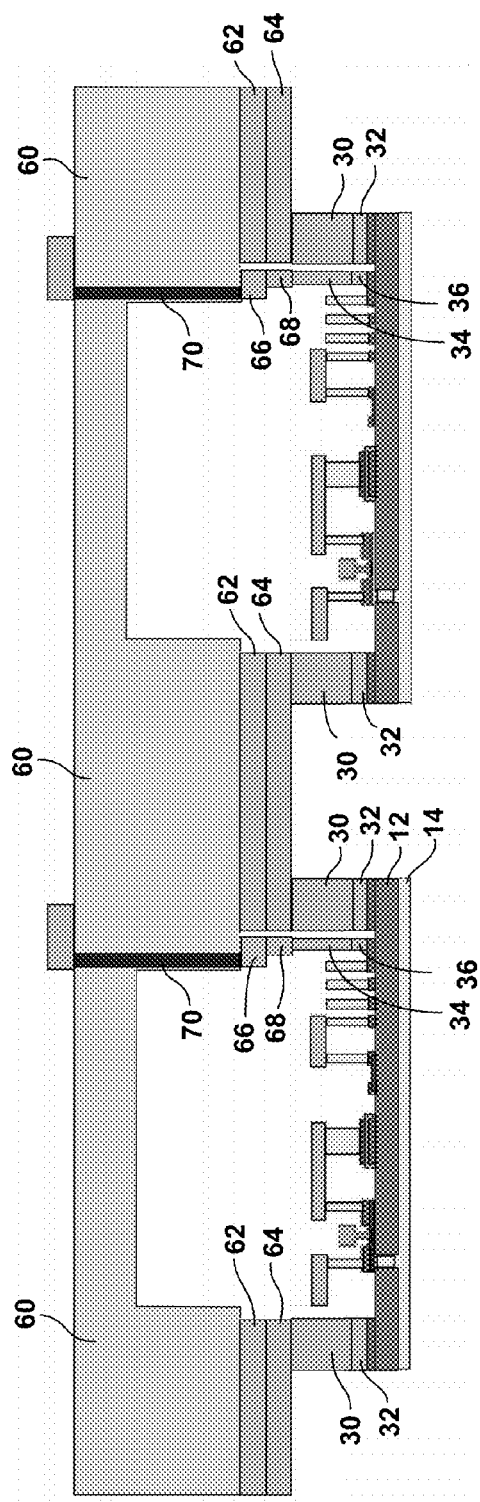
FIG. 5 shows a cross-sectional schematic showing a cover wafer with bonded integrated circuit (IC) dice in accordance with the present disclosure.

During this step, as shown in FIG. 5, the double-plated metal rings 30, 32 and the double-plated sealing rings 62, 64 are bonded together using thermocompression bonding to form hermetically-sealed cavities, while the double-plated bumps 34, 36 and double-plated bumps 66, 68 are bonded together using thermocompression bonding to form electrical contacts. It is preferable to offset the double-plated bumps 66, 68 from the through-cover copper-filled vias, as depicted in FIG. 5, so that the double-plated bumps 66, 68 are at least partially directly on the cover wafer 60. However, this is not a requirement, and a configuration where the double-plated bumps 66, 68 are aligned with the through-wafer vias 70 is also feasible, though planarity must be carefully controlled. Each die 10 may be sequentially bonded using thermocompression. Though it is preferable to use thermocompression bonding, other approaches known by experts in the field can also be used such as solder bumps, AuSn bonding, or eutectic bonding.

Figure 6:
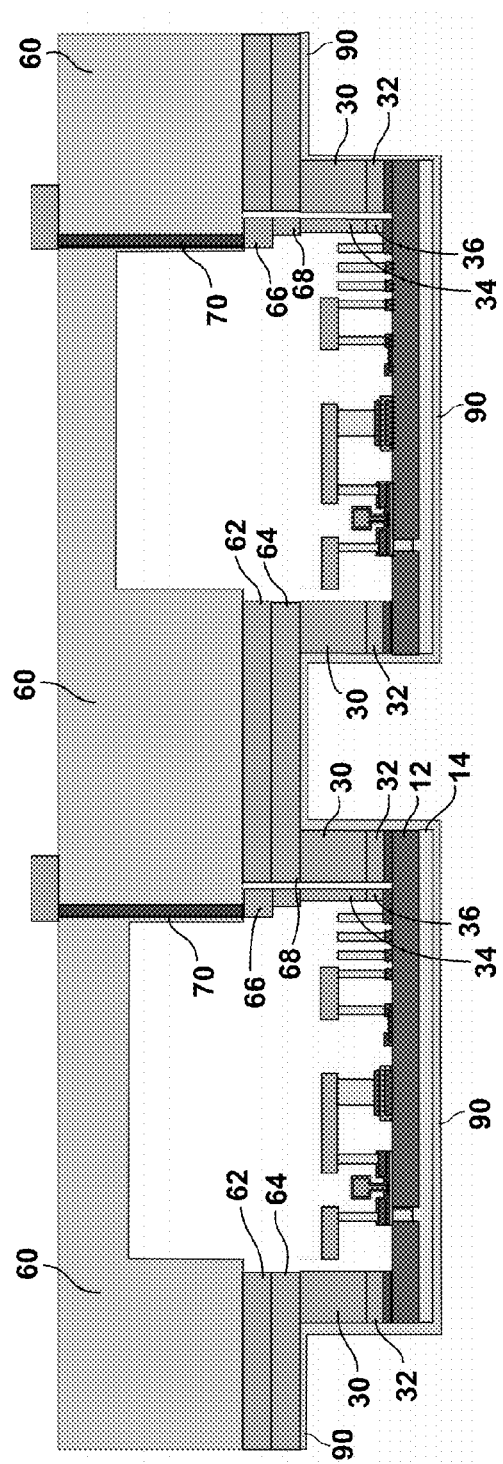
FIG. 6 shows a cross-sectional schematic showing a cover wafer with bonded IC dice and sputtered Ti/Au layer stack for heat spreader electroforming in accordance with the present disclosure.

Post die bonding, the cover wafer 60 is sputtered with a metallic membrane layer 90, which may be a Ti layer on the order of 500 A thick and an Au layer on the Ti layer with a thicknesses on the order of 3000 A or more. This step, shown in FIG. 6, is used to initiate the fabrication of the electroformed heat spreaders.

Figure 7A:
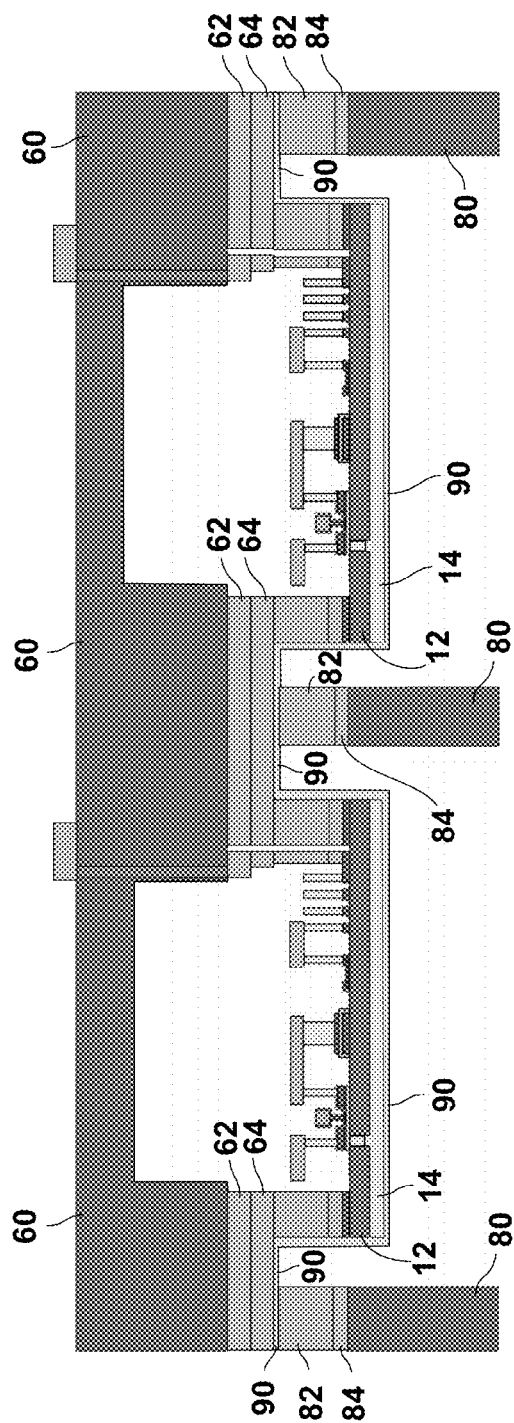
FIG. 7A shows a cover wafer bonded to an IC dice and a body wafer bonded to the cover wafer.

Then, using wafer-to-wafer bonding, and a bonder tool, such as a EVG wafer bonder, the body wafer 80 is aligned and bonded to the cover wafer 90 by thermocompression bonding of the Au in metallic membrane layer 90 to the Au 82 layer on the body wafer 80, as shown in FIG. 7A. For wafer bonding, the process conditions may be 250 C, 3000 N, and 30 min bond, though this is dependent on the design density.

Figure 7B:
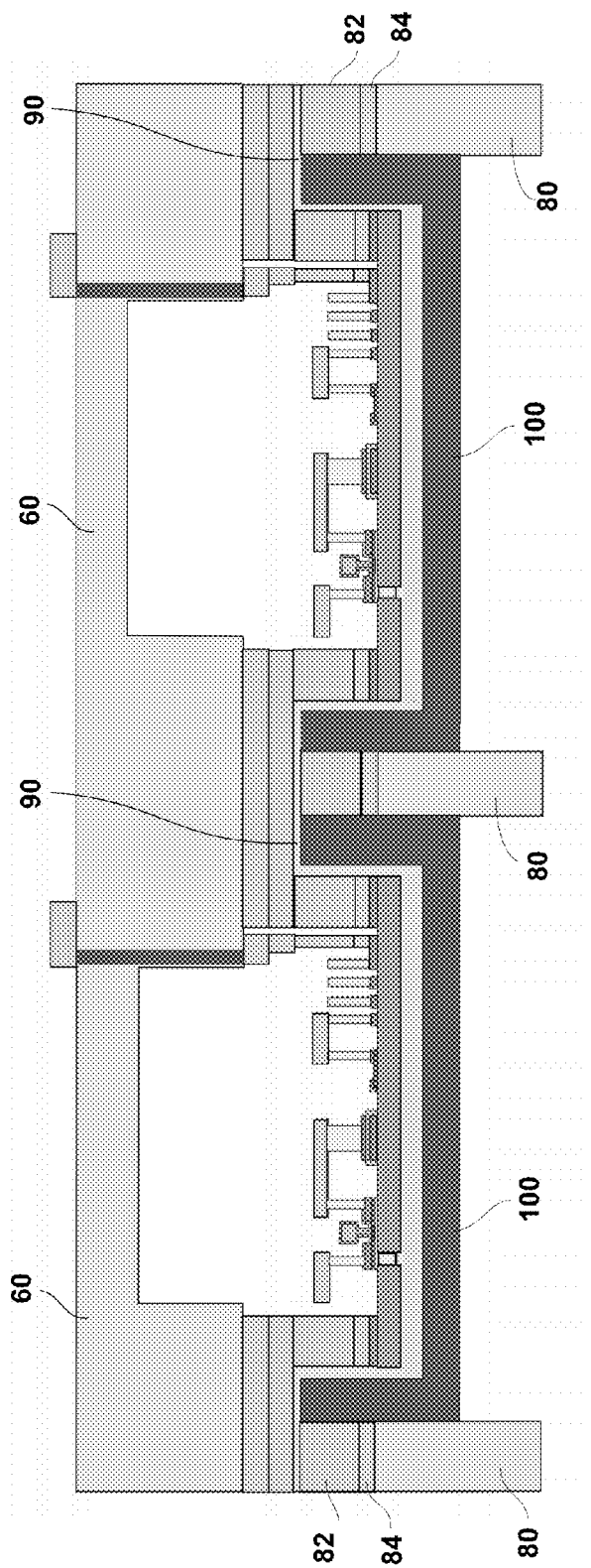
FIG. 7B shows half-way through electroform plating of a heat sink.
Figure 7C:
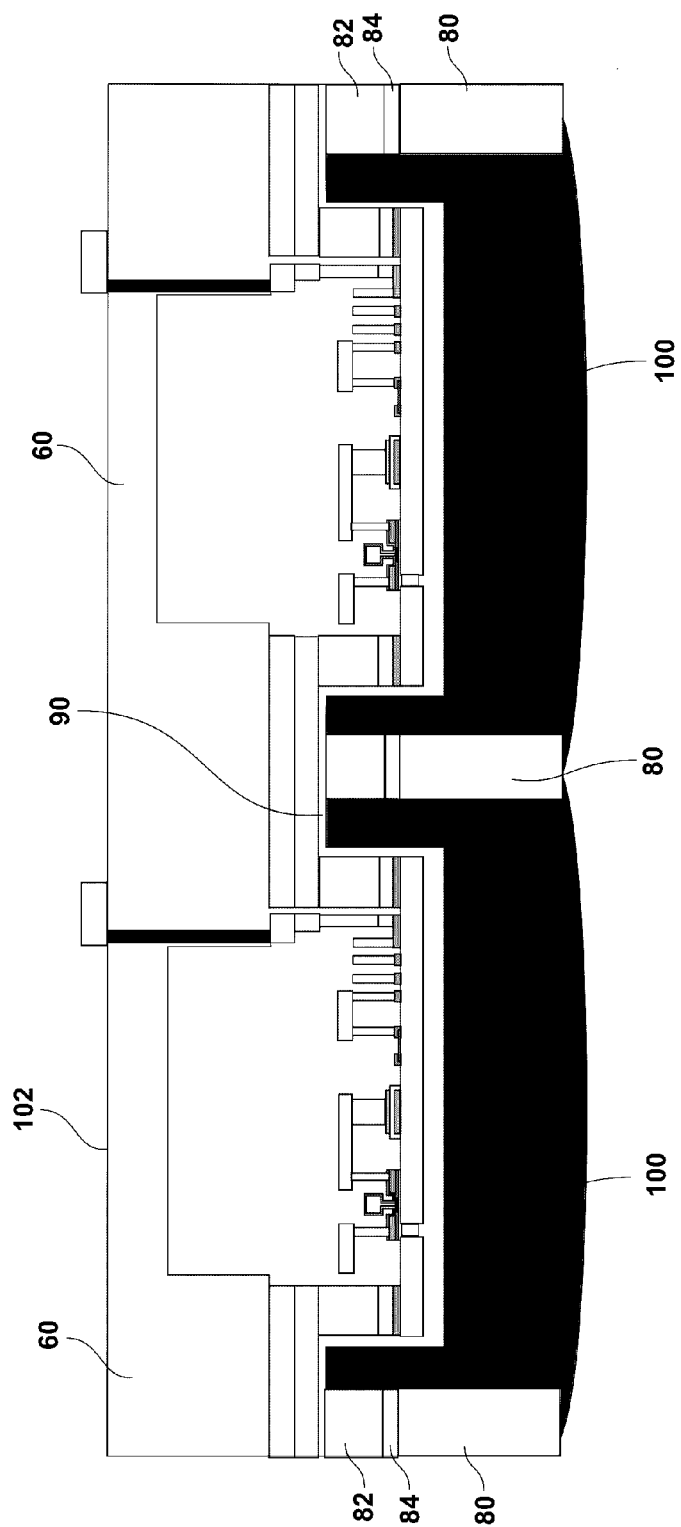
FIG. 7C shows after a plating step is completed showing overplating.

The heat spreaders 100 are then electroformed using the body wafer 80, which may be oxidized high-resistivity silicon, as a plating mold, as depicted in FIGS. 7B and 7C. The topside 102 of the cover wafer 60 is protected during electroplating to prevent metal deposition on that surface. Unlike sidewall plating, the bottom-up electroplating of the yields void-free heat spreaders 100. Materials to form the integrated heat spreaders preferably feature high thermal conductivity, and a controllable coefficient of thermal expansion. Examples of such materials are copper, silver, copper alloys, copper-CNT (copper-carbon nanotubes), or other materials known by experts in the field. The cavities in the body wafer 80 are over-plated by design, as shown in FIG. 7C.

Figure 7D:
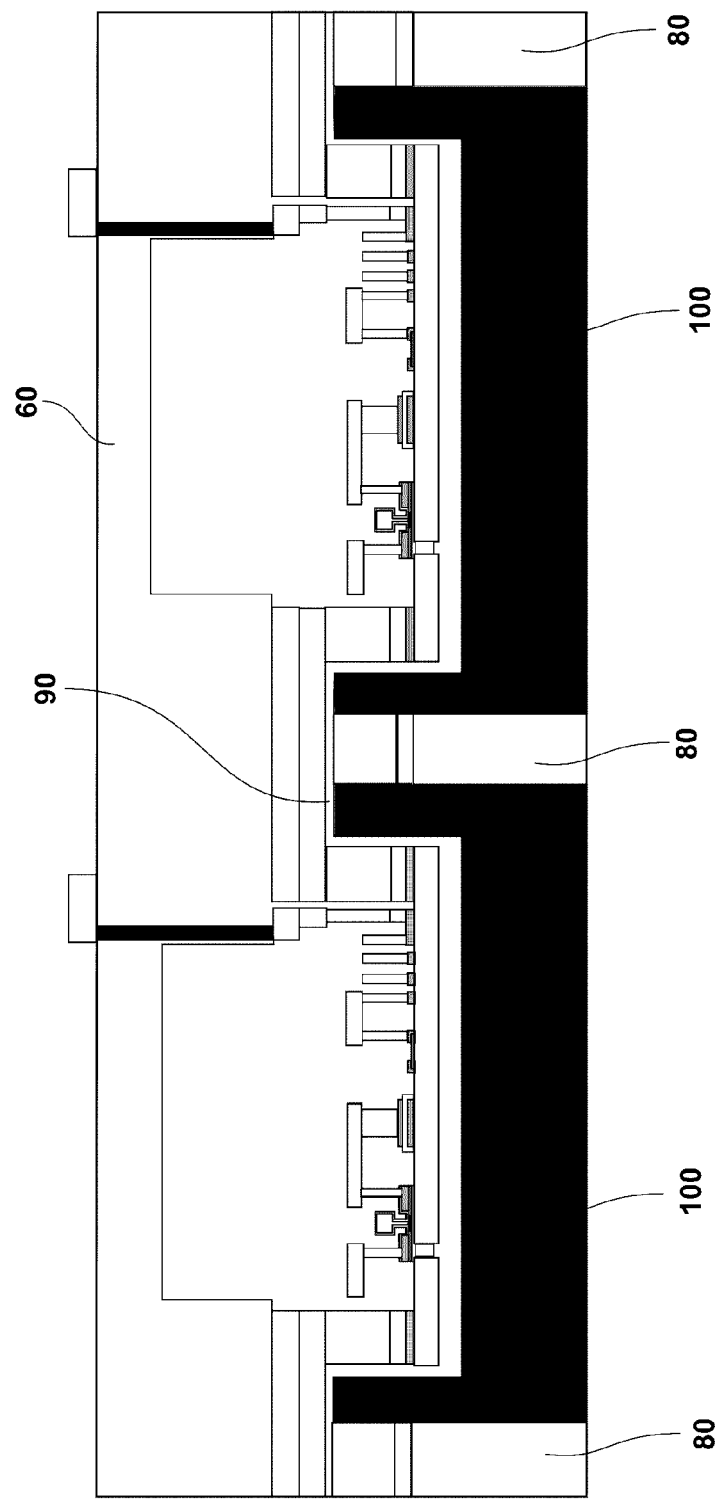
FIG. 7D shows after chemical-mechanical planarization in accordance with the present disclosure.
Figure 8:
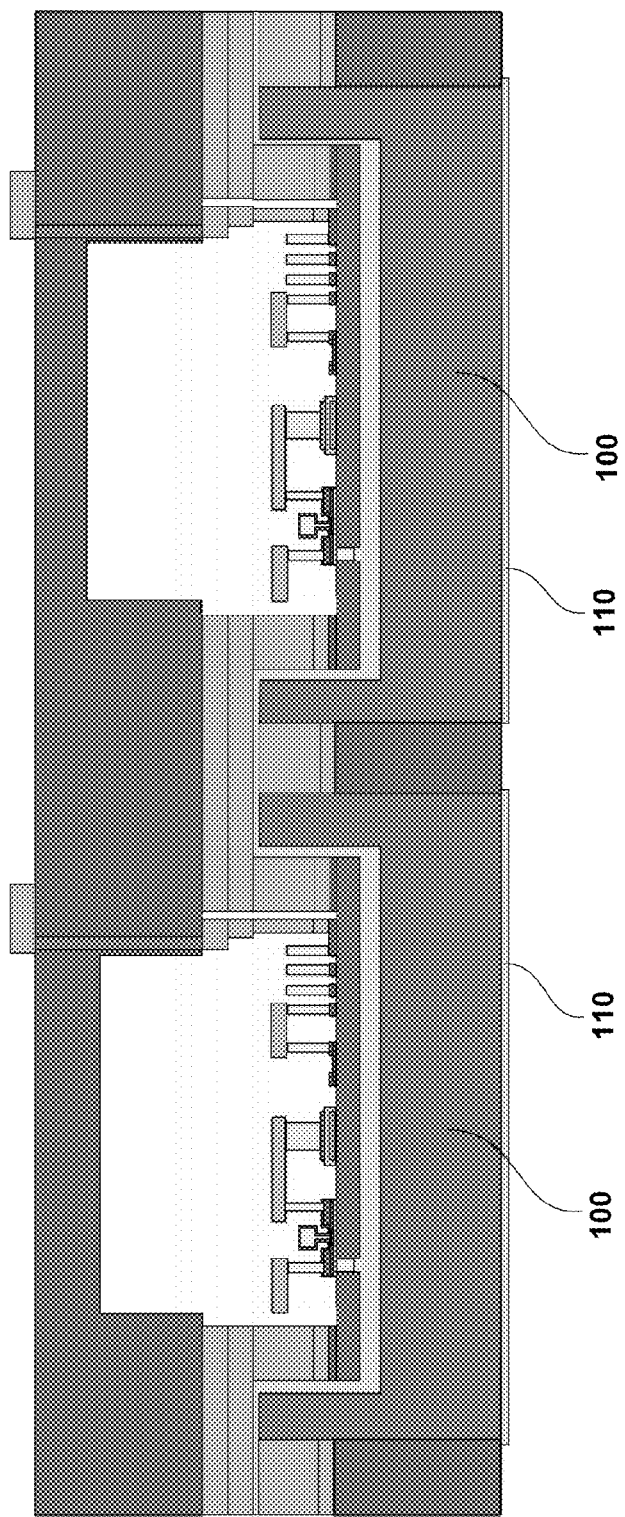
FIG. 8 shows a cross-sectional schematic showing wafer-level packages for IC dice with integrated heat spreaders capped with Au passivation in accordance with the present disclosure.

After electroforming, the body wafer 80 and the heat spreaders 100 are polished using chemical mechanical planarization (CMP), which may be copper CMP to achieve high planarity, as shown in FIG. 7D. Then, a backing layer 110 is deposited and patterned on the heat spreaders 100 to prevent oxidation of the heat spreaders 100. The backing layer 110 may be formed by sputtering a Ti layer on the heat spreaders 100 and sputtering an Au layer on the Ti layer using conventional microfabrication techniques, as shown in FIG. 8. The Ti layer in this and other steps prevents the Au layer from diffusing into the heat spreaders.

Figure 9B:
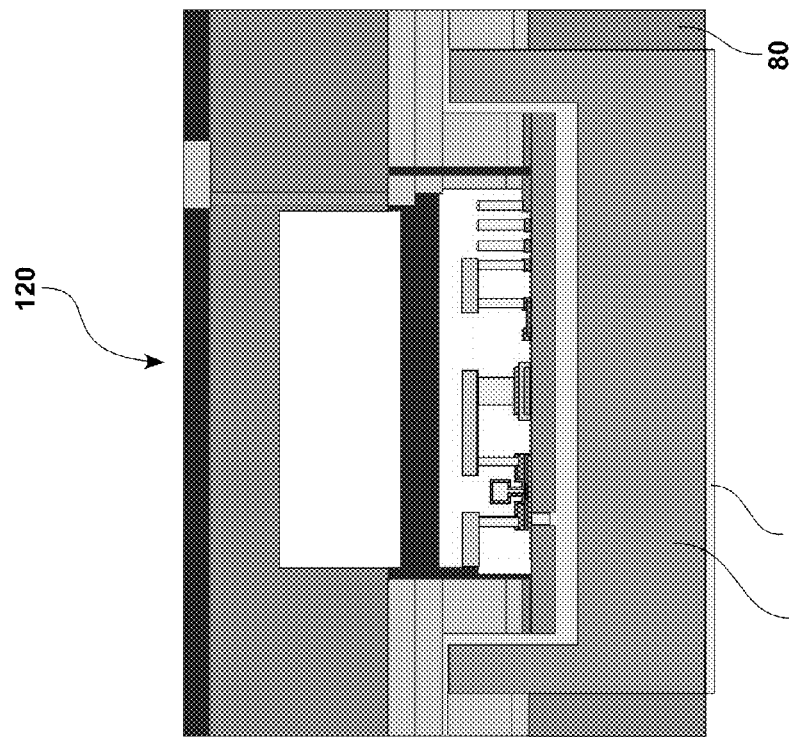
FIGS. 9A and 9B show diced packages in accordance with the present disclosure.
Figure 9A:
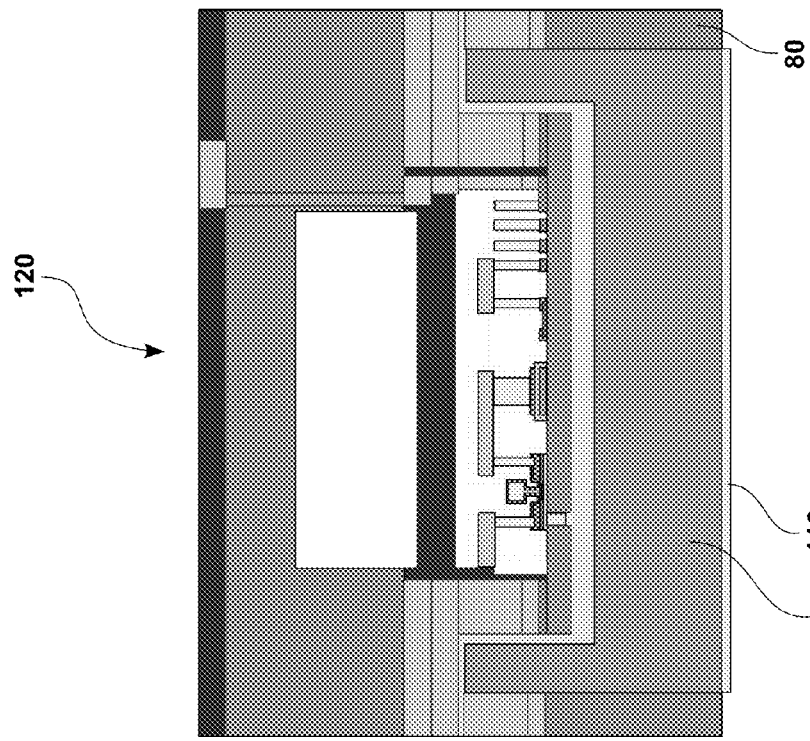

Finally, individual packages 120 are diced using laser dicing or mechanical dicing. The dicing as shown in FIG. 9 is aligned to be approximately midway through portions of the body wafer 80 between the cavities 86. The result is wafer-level packages 120 for IC dice with integrated heat spreaders and direct die-to-package through-package interconnects.

Figure 10:
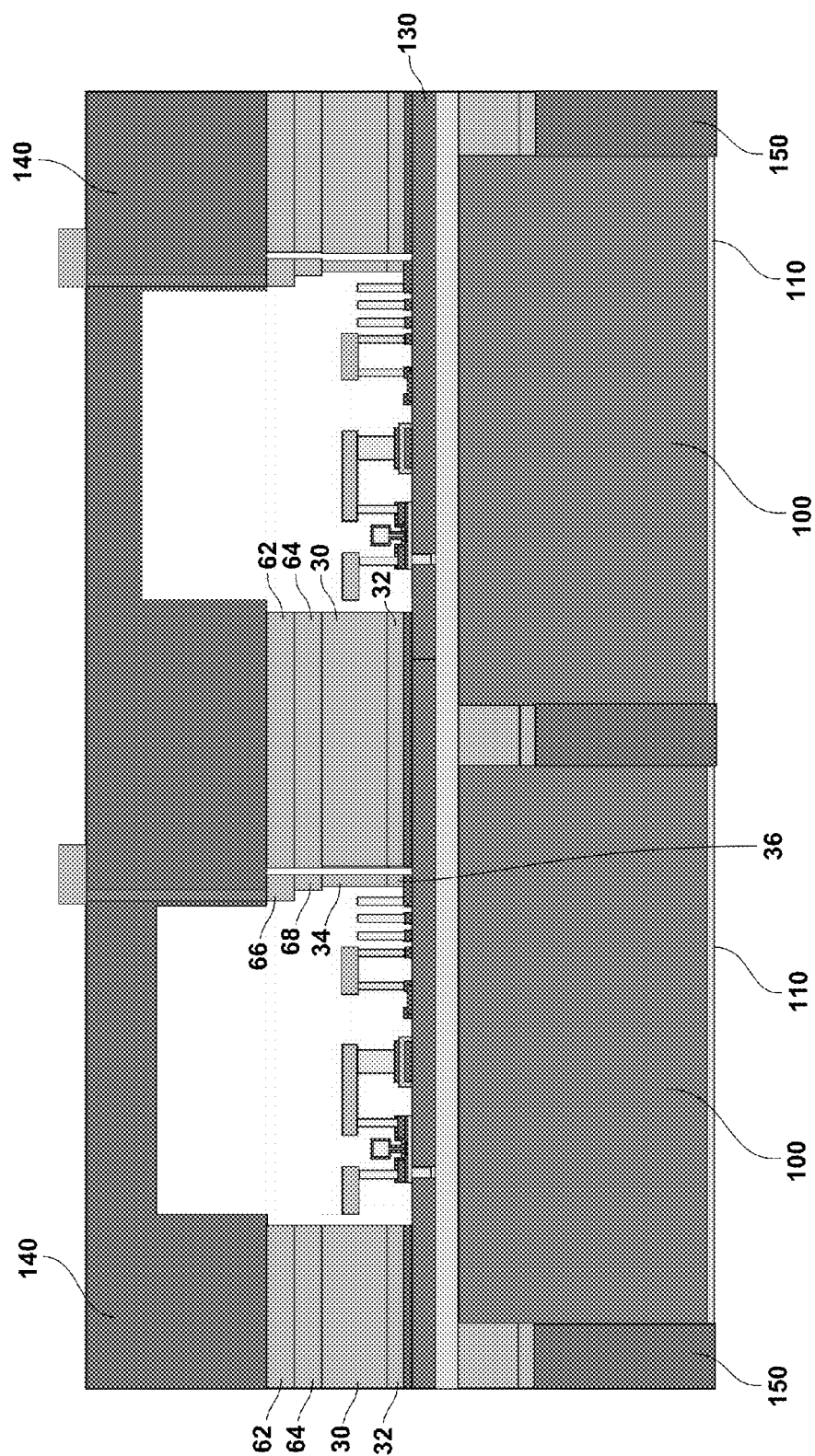
FIG. 10 shows a cross-sectional schematic showing wafer-level packaging for IC wafers with integrated heat spreaders in accordance with the present disclosure.

In another embodiment, the die 10 on an IC wafer 130 are not diced, and the entire IC wafer 130 is directly bonded onto the cover wafer 140, followed by integration of the body wafer 150 and heat spreader 100. FIG. 10 shows the wafer-level integration. In contrast to the description above where only known good dice are packaged, the wafer-level approach relies on wafer stacking. First, an IC wafer 130 is bonded to a cover wafer 140 by bonding the double-plated metal rings 30, 32 to the double-plated sealing rings 62, 64, and by bonding the double-plated bumps 34, 36 to the double-plated bumps 66, 68 using bonding wafer technologies. The result is that regions on the IC wafer 130 with circuitry are sealed within a hermetic cavity. Then, the body wafer 150 is bonded using wafer bonding technologies to the back of the IC wafer 130. Next, the heat spreaders 100 are electroformed in the cavities of the body wafer 150, which are aligned with regions on the IC wafer 130 that have circuitry. Then, the heat spreaders 100 are planarized using CMP, similar to the processes described above. Then, a backing layer 110 is deposited and patterned on the heat spreaders 100 to prevent oxidation of the heat spreaders 100.

Tests on the present disclosure have been performed. The tests show that the integrated heat spreaders result in an integrated chip performance enhancement up to 40% compared to integrated chips conventionally mounted on heat spreaders. This has been demonstrated by comparing the operating power for a given junction temperature, and a junction temperature for a given operating power. The double-plated sealing rings on dice and cover wafers were shown to provide hermetically-sealed packages. This has been demonstrated by submitting these chips to a hermetic seal test (MIL-STD-883, Method 1014) at ORS labs.

Further, inspection indicated that no copper was plated inside the sealed cavities while electroforming the heat spreaders on the backside of the dice.

A low loss of less than 0.1 dB at 20 GHz was demonstrated for the bump process when doing Au—Au thermocompression bonding using CPW test structures going from the cover wafer to the die and back to the cover wafer.

The integrated heat spreaders were shown by X-ray imaging to be void-free for bottom-up copper plating using a high-resistivity silicon wafer as a plating mold.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:
1. A method for wafer level packaging comprising:
   forming one or more die;
   forming a plated metal ring on each die;
   forming a cover wafer, the cover wafer having one or more plated seal rings;
   forming a body wafer, the body wafer having cavities and a metal layer on a first side of the body wafer;

aligning a respective die to the cover wafer so that a plated metal ring on the respective die is aligned to a respective plated seal ring on the cover wafer;

bonding the plated metal ring on the respective die to the respective plated seal ring;

aligning the body wafer to the cover wafer so that a respective cavity of the body wafer surrounds each respective die bonded to the cover wafer and so that the metal layer on the body wafer is aligned with at least one plated seal ring on the cover wafer; and bonding the metal layer on the first side of the body wafer to the plated seal ring on the cover wafer;

wherein each plated metal ring has a first height and each plated seal ring has a second height.

2. The method of claim 1 further comprising:

electroforming a respective heat spreader surrounding each respective die using the body wafer as a plating mold;

polishing the heat spreaders using chemical mechanical planarization; and forming a backing layer on the heat spreaders to prevent oxidation of the heat spreaders.

3. The method of claim 2 further comprising:

dicing to form individual packages for integrated circuit dice.

4. The method of claim 1 wherein forming one or more die, each die comprising a plated metal ring comprises:

providing a substrate;

forming circuitry on the substrate;

forming the plated metal ring on the substrate, wherein the plated metal ring surrounds the circuitry and wherein the plated metal ring has a first height above the substrate; and forming an interconnect bump on the substrate, wherein the interconnect bump is coupled to the circuitry and has the first height above the substrate.

5. The method of claim 1 wherein forming a cover wafer, the cover wafer having one or more plated seal rings comprises:

providing the cover wafer;

providing one or more cavities in the cover wafer on a first side of the cover wafer, wherein the cavities in the cover wafer do not extend through the cover wafer;

forming one or more plated seal rings on the first side of the cover wafer, wherein each plated seal ring surrounds a cavity in the cover wafer, and where each plated seal ring has a second height above the cover wafer; and forming a plated cover wafer interconnect bump on the first side of the cover wafer, wherein each plated cover wafer interconnect bump has the second height above the cover wafer, and a wherein each plated cover wafer interconnect bump is electrically coupled to circuitry on a second side of the cover wafer.

6. The method of claim 1 wherein forming the body wafer, the body wafer having cavities and the metal layer on the first side of the body wafer comprises:

providing the body wafer;

providing one or more cavities in the body wafer, wherein the cavities in the body wafer extend through the body wafer; and forming the metal layer on the first side of the body wafer.

7. The method of claim 1 wherein:

the substrate comprises GaN-on-SiC, GaAs, InP, or CMOS;

the cover wafer comprises high-resistivity silicon, quartz, glass, or silicon carbide; and the body wafer comprises high-resistivity silicon, quartz, glass, or silicon carbide;

wherein the cover wafer and the body wafer comprise the same material.

8. The method of claim 1:

wherein bonding the plated metal ring on the respective die to the respective plated seal ring comprises thermocompression bonding; and wherein bonding the metal layer on the first side of the body wafer to the plated seal ring on the cover wafer comprises thermocompression bonding.

9. The method of claim 1 wherein:

the plated metal ring comprises gold and the plated metal ring comprises a first plated metal ring formed on the substrate and a second plated metal ring formed on the first plated metal ring; and each plated seal ring comprises gold and the plated seal ring each comprise a first plated seal ring formed on the cover wafer and a second plated seal ring formed on the first plated seal ring.

10. The method of claim 1 further comprising:

forming at least one interconnect bump on at least one die, wherein the interconnect bump is coupled to circuitry on the die and has the first height;

forming at least one plated cover wafer interconnect bump on a first side of the cover wafer, wherein each plated cover wafer interconnect bump has the second height;

aligning the at least one interconnect bump to the at least one plated cover wafer interconnect bump; and bonding the at least one interconnect bump to the at least one plated cover wafer interconnect bump using thermocompression bonding.

11. The method of claim 10 further comprising:

forming in the cover wafer an electrical connection from the plated cover wafer interconnect bump to circuitry on a second side of the cover wafer.

12. A wafer level package comprising:

one or more die;

a plated metal ring on each die;

a cover wafer, the cover wafer having one or more plated seal rings, wherein the plated metal ring on a respective die is bonded to a respective plated seal ring; and a body wafer, the body wafer having cavities and a metal layer on a first side of the body wafer, wherein the metal layer on the first side of the body wafer is bonded to the plated seal ring on the cover wafer, and wherein each respective cavity surrounds respective die;

wherein each plated metal ring has a first height and each plated seal ring has a second height.

13. The wafer level package of claim 12 further comprising:

a heat spreader electroformed on a backside of each die and within the cavity surrounding the die; and a backing layer on the heat spreader to prevent oxidation of the heat spreader.

14. The wafer level package of claim 12 wherein at least one die comprises:

a substrate;

circuitry on the substrate;

the plated metal ring on the substrate, wherein the plated metal ring surrounds the circuitry and wherein the plated metal ring has a first height above the substrate; and an interconnect bump on the substrate, wherein the interconnect bump is coupled to the circuitry and has the first height above the substrate.

15. The wafer level package of claim 12 wherein the cover wafer comprises:
- one or more cavities in the cover wafer on a first side of the cover wafer, wherein the cavities in the cover wafer do not extend through the cover wafer;
- one or more plated seal rings on the first side of the cover wafer, wherein each plated seal ring surrounds a cavity in the cover wafer, and where each plated seal ring has a second height above the cover wafer; and
- one or more plated cover wafer interconnect bumps on the first side of the cover wafer, wherein each plated cover wafer interconnect bump has the second height above the cover wafer, and a wherein each plated cover wafer interconnect bump is electrically coupled to circuitry on a second side of the cover wafer.

16. The wafer level package of claim 12 wherein the body wafer comprises:
- one or more cavities in the body wafer, wherein the cavities in the body wafer extend through the body wafer.

17. The wafer level package of claim 12 wherein:
- the die comprises GaN-on-SiC, GaAs, InP, or CMOS;
- the cover wafer comprises high-resistivity silicon, quartz, glass, or silicon carbide;
- the body wafer comprises high-resistivity silicon, quartz, glass, or silicon carbide; and
- the cover wafer and the body wafer comprise the same material.

18. The wafer level package of claim 12 wherein:
- the plated metal ring comprises gold and the plated metal ring comprises a first plated metal ring formed on the substrate and a second plated metal ring formed on the first plated metal ring; and
- each plated seal ring comprises gold and the plated seal ring each comprise a first plated seal ring formed on the cover wafer and a second plated seal ring formed on the first plated seal ring.

19. The wafer level package of claim 12 further comprising:
- at least one interconnect bump on at least one die, wherein the interconnect bump is coupled to circuitry on the die and has the first height;
- at least one plated cover wafer interconnect bump on a first side of the cover wafer, wherein each plated cover wafer interconnect bump has the second height;
- wherein the at least one interconnect bump is bonded to the at least one plated cover wafer interconnect bump; and
- wherein the cover wafer comprises an electrical connection from the plated cover wafer interconnect bump to circuitry on a second side of the cover wafer.

20. A method for wafer level packaging comprising:
- forming an integrated circuit wafer having a plurality of circuit regions;
- forming a plurality of plated metal rings, each plated metal ring surrounding a respective circuit regions;
- forming a cover wafer, the cover wafer having one or more plated seal rings and one or more cavities;
- forming a body wafer, the body wafer having cavities and a metal layer on a first side of the body wafer;
- aligning the integrated circuit wafer to the cover wafer so that a plated metal ring on each respective circuit region is aligned to a respective plated seal ring on the cover wafer, and so that each circuit region is aligned to a respective cavity in the cover wafer;
- bonding the plurality of plated metal rings to the respective aligned plated seal rings using thermocompression bonding;
- aligning the body wafer to the integrated circuit wafer so that each respective cavity of the body wafer is aligned with each respective circuit region; and
- bonding the body wafer to the integrated circuit wafer using thermocompression bonding; and
- electroforming a respective heat spreader in each cavity of the body wafer;
- wherein each plated metal ring has a first height and each plated seal ring has a second height.

* * * * *